(12) United States Patent
Tran (10) Patent No.: US 6,879,508 B2
(45) Date of Patent: Apr. 12, 2005

(54) MEMORY DEVICE ARRAY HAVING A PAIR OF MAGNETIC BITS SHARING A COMMON CONDUCTOR LINE

(75) Inventor: Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/692,617

(22) Filed: Oct. 24, 2003

(65) Prior Publication Data

US 2004/0090809 A1 May 13, 2004

Related U.S. Application Data

(62) Division of application No. 10/098,903, filed on Mar. 14, 2002, now Pat. No. 6,778,421.

(51) Int. Cl.[7] .............................................. G11C 17/00
(52) U.S. Cl. ........................ 365/100; 365/105; 365/158
(58) Field of Search ................................ 365/171, 173, 365/46, 100, 148, 158, 105

(56) References Cited

U.S. PATENT DOCUMENTS

| | | | | |
|---|---|---|---|---|
| 6,034,887 A | * | 3/2000 | Gupta et al. ................ | 365/171 |
| 6,351,408 B1 | | 2/2002 | Schwarzl et al. | |
| 6,420,215 B1 | * | 7/2002 | Knall et al. ................ | 438/131 |
| 6,473,337 B1 | * | 10/2002 | Tran et al. .................. | 365/173 |
| 6,631,085 B2 | * | 10/2003 | Kleveland et al. .......... | 365/175 |
| 6,693,821 B2 | * | 2/2004 | Hsu et al. .................... | 365/158 |
| 2001/0043488 A1 | | 11/2001 | Weber et al. | |
| 2002/0085411 A1 | | 7/2002 | Freitag et al. | |

FOREIGN PATENT DOCUMENTS

| | | |
|---|---|---|
| EP | 1 109 170 | 6/2001 |
| WO | WO00/577423 | 9/2000 |

* cited by examiner

Primary Examiner—Gene N. Auduong (57) ABSTRACT

A data storage device having parallel memory planes is disclosed. Each memory plane includes a first resistive cross point plane of memory cells, a second resistive cross point plane of memory cells, a plurality of conductive word lines shared between the first and second planes of memory cells, a plurality of bit lines, each bit line coupling one or more cells from the first plane to another memory cell in the second plane, and a plurality of unidirectional elements. Further, the one unidirectional element couples a first memory cell from the first plane to a selected word line and a selected bit line in a first conductive direction and a second unidirectional element couples a second cell from the second plane to the selected word line and selected bit line in a second conductive direction. The device further provides for a unidirectional conductive path to form from a memory cell in the first plane to a memory cell in the second plane sharing the same bit line.

7 Claims, 7 Drawing Sheets

MEMORY DEVICE ARRAY HAVING A PAIR OF MAGNETIC BITS SHARING A COMMON CONDUCTOR LINE

This application is a Division of application Ser. No. 10/098,903 filed Mar. 14, 2002, now U.S. Pat. No. 6,778,421

BACKGROUND OF THE INVENTION

The present invention pertains to the field of resistive memory cell arrays. More particularly, this invention relates to a memory array having memory bit pairs sharing a common conductor to increase array density.

A resistive random access memory (RAM) is a cross point type memory array of a planar matrix of spaced memory cells sandwiched between two meshes of conductors running in orthogonal directions above and below the cells. An example is the resistive RAM array 10 shown in FIG. 1. The row conductors 12 running in one direction are referred to as the word lines, and the column conductors 14 extending in a second direction usually perpendicular to the first direction are referred to as the bit lines. The memory cells 16 are usually arranged in a square or rectangular array so that each memory cell unit 16 is connected with one word line 12 and an intersecting bit line 14.

In a resistive RAM array, the resistance of each memory cell has more than one state, and the data in the memory cell is a function of the resistive state of the cell. The resistive memory cells may include one or more magnetic layers, a fuse or anti-fuse, or any element that stores or generates information by affecting the magnitude of the nominal resistance of the element. Other types of resistive elements used in a resistive RAM array include poly-silicon resistors as part of a read-only memory, or phase charge material as rewritable memory device.

One type of resistive random access memory is a magnetic random access memory (MRAM), in which each memory cell is formed of a plurality of magnetic layers separated by insulating layers. One magnetic layer is called a pinned layer, in which the magnetic orientation is fixed so as not to rotate in the presence of an applied magnetic field in the range of interest. Another magnetic layer is referred to as a sense layer, in which the magnetic orientation is variable between a state aligned with the state of the pinned layer and a state in misalignment with the state of the pinned layer. An insulating tunnel barrier layer sandwiches between the magnetic pinned layer and the magnetic sense layer. This insulating tunnel barrier layer allows quantum mechanical tunneling to occur between the sense layer and the pinned layer. The tunneling is electron spin dependent, causing the resistance of the memory cell, a function of the relative orientations of the magnetizations of the sense layer and the pinned layer. The variations in the junction resistance for the two states of the sense layer determine the data stored in the memory cell. U.S. Pat. No. 6,169,686, granted to Brug et al. on Jan. 2, 2001 discloses such a magnetic memory cell memory.

Figures 1, 2, 3:
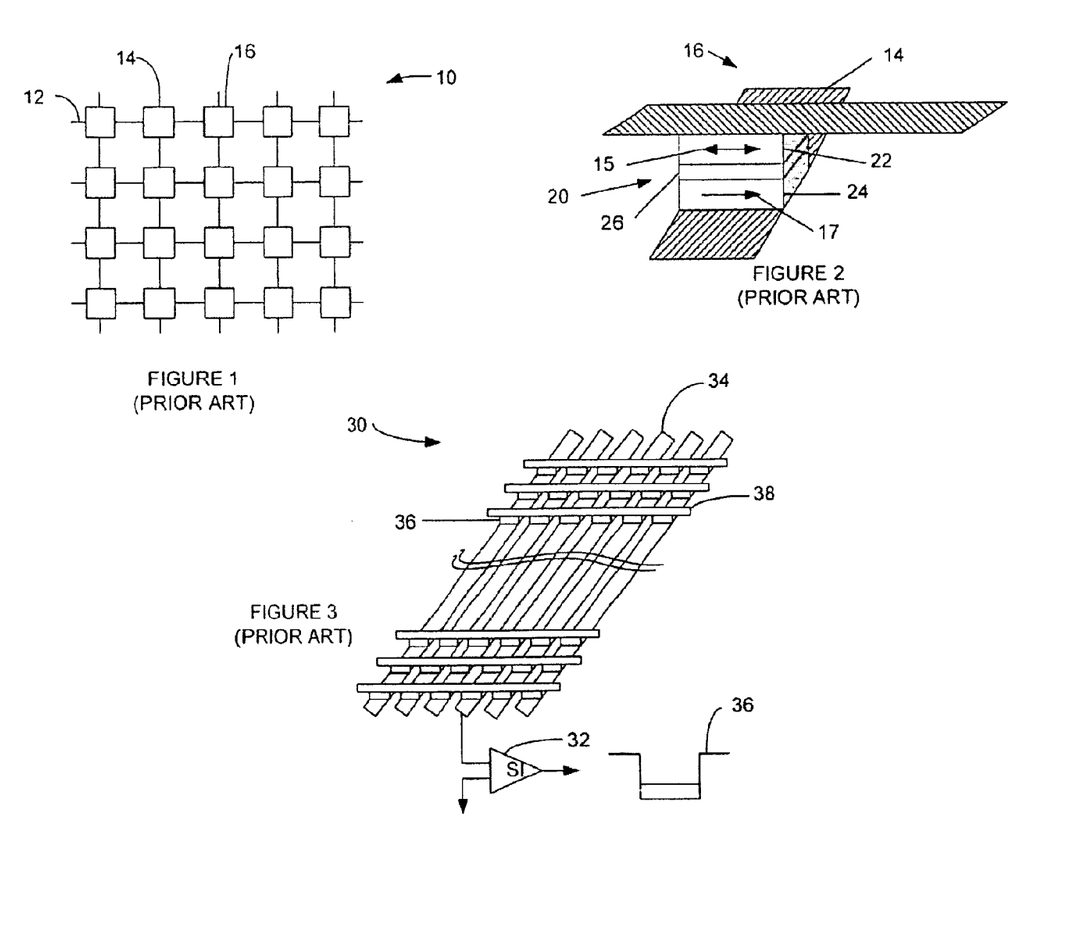
FIG. 1 is a schematic view showing a prior art resistive cross point memory cell according to the present invention.
FIG. 2 is a schematic view showing the prior art structure of a MRAM memory cell and the conductors connected thereto.
FIG. 3 is a schematic view showing the prior art memory array structure with sensing elements according to the present invention.

Referring to FIG. 2, a MRAM memory cell is shown. Memory unit 16 is shown as a three-layer memory cell 20. In each cell 20 a bit of information is stored according to the orientation of a magnetic sense layer 22 of the cell 20. Usually, the cell 20 has two stable magnetic states corresponding to the logic states "1" and "0." The two-way arrow 15 on the sense layer 22 shows this binary-state capability. A pinned layer 24 in the cell 20 is separated from the sense layer by a thin insulator 26. Pinned layer 24 has a fixed magnetic orientation, such as shown by the one-way arrow 17 on layer 24. When the magnetic state of the sense layer 22 is oriented in the same direction as the direction of the magnetization of the pinned layer 24, the cell magnetization is referred to as "parallel." Similarly, when the magnetic state of the sense layer 22 is oriented in the direction opposite to the direction of the magnetization of the pinned layer 24, the cell magnetization is referred to as "anti-parallel." These orientations correspond to a low resistance state and a high resistance state, respectively.

The magnetic state of a selected memory cell 20 may be changed by applying currents to a word line 12 and a bit line 14 crossing the selected memory cell. The currents produce two orthogonal magnetic fields that, when combined, will switch the magnetic orientation of the selected memory cell 20 between the parallel and anti-parallel states. Other unselected memory cells receive only a magnetic field from either the word line or the bit line crossing the unselected memory cells. The single field is not strong enough to change the magnetic orientation of the unselected cells, so they retain their magnetic orientation.

Referring to FIG. 3, an MRAM memory array 30 is shown. A sense amplifier 32 is connected to the bit line 34 of a selected memory cell 36. A voltage $V_r$ is applied to the word line 38 of the selected memory cell 36, and sense amplifier 32 applies a voltage to the bit line 34 of cell 36. The sense amplifier 32 provides an amplified output 39 reflecting the state of the memory cell 36. The same bit line voltage is applied to all of the bit line 34, effectively biasing all the cells on unselected rows to zero potential. This action isolates the bit line currents from one another, effectively blocking most of the leakage current that might otherwise flow through secondary paths, possibly causing errors in the sensing function of the selected memory cell.

Several issues relevant to all memory arrays are the need to simplify structures, the desire to increase memory storage density, and the need to reduce conductive lines within the array. The MRAM memory array addresses the first issue very well in that the MRAM bit cell is one of the simplest storage cells currently know. The ability to increase memory storage density has typically been achieved by reducing the size of each cell within the array. The reduction of conductive lines has been limited to how many cells there are arranged in rows and columns.

Accordingly, what is needed is a solution to increasing array density without having to first reduce cell dimensions. Further, what is needed is a solution to reduce conductor paths by sharing common paths with two cell pairs.

SUMMARY OF THE INVENTION

According to the present invention, a data storage device having parallel memory planes is disclosed. Each memory plane includes a first resistive cross point plane of memory cells, a second resistive cross point plane of memory cells, a plurality of conductive word lines shared between the first and second planes of memory cells, a plurality of bit lines, each bit line coupling one or more cells from the first plane to another memory cell in the second plane, and a plurality of unidirectional elements. Further, the one unidirectional element couples a first memory cell from the first plane to a selected word line and a selected bit line in a first conductive direction and a second unidirectional element couples a second cell from the second plane to the selected word line and selected bit line in a second conductive direction. The invention further provides for a unidirectional conductive path to form from a memory cell in the first plane to a memory cell in the second plane sharing the same bit line.

The data storage device further includes multiple read circuits which are each coupled to one or more groups of memory cells by a respective bit line and operable to sense current flow through a memory cell of the associated groups. The read circuit further comprises a sense amplifier, which may be a current mode sense amplifier.

In an alternative embodiment, a data storage device having parallel memory planes is also disclosed. In the alternative embodiment, first there is included a first resistive cross point plane of memory cells and a second resistive cross point plane of memory cells. Further, a word line plane is shared between the first and second planes of memory cells. A plurality of bit lines is provided where each bit line couples one memory cell from the first plane to another memory cell in the second plane. A plurality of unidirectional elements are also provided where each unidirectional element serves to couple one memory cell in either plane wherein the unidirectional elements prevent interference of one memory cell with another memory cell sharing the same bit line.

Other aspects and advantages of the present invention will become apparent from the following detailed description, which in conjunction with the accompanying drawings illustrates by way of example the principles of the present invention.

DETAILED DESCRIPTION OF THE INVENTION

Figure 4:
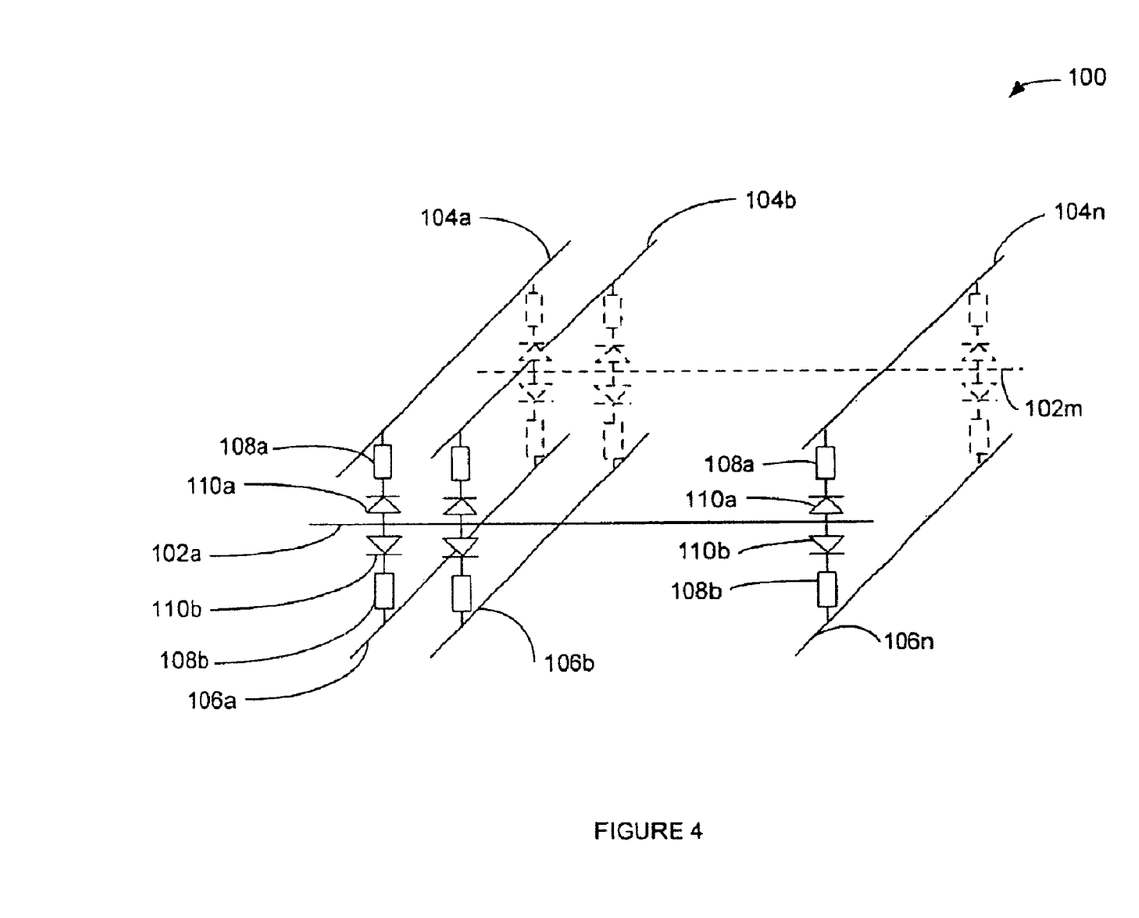
FIG. 4 illustrates an MRAM memory cell array that includes a common word lines plane with back-to-back diode memory cell configuration in accordance with the present invention.

FIG. 4 illustrates an MRAM memory cell array 100 that includes a common word line plane with back-to-back diode memory cell configuration. A three dimensional perspective view illustrates how multiple memory cells are arranged to increase cell density while reducing the number of conductor lines typically required in the prior art. The memory array 100 includes a plurality of row conductor lines 102a–m, each of which serves as a common conductor to memory cells 108a and 108b. Unidirectional conductors 110a and 110b are mated with memory cells 108a and 108b, respectively. The unidirectional switches 110a and 110b enable the common conductor to be active in a manner that only one bit in the bit pair is read, sensed or written to according to the read, sense and write processes described below, without the other cell interfering with the processes.

Memory array 100 further includes a first column conductor line 104 and a second column conductor line 106. A plurality of first column conductor lines 104a–n is provided and a plurality of second column conductor lines 106a–n are also provided. First column conductor line 104a couples to the opposite end of each memory cell 108a found in the same column. Likewise, each second column conductor line 106a further connects each memory cell 108b that share the same column. The unidirectional conductors 110 enable sense paths, write, and read paths to be shared with the common row conductor 102 in a manner that enables a pair of memory cells 108a and b to share the same row conductor.

Row conductors 102 function as word lines and extend along the X direction in a plane on one side of the memory cell array 100. First column conductor lines 104 and second conductor lines 106 function as bit lines extending along the Y direction in a plane on another side of the memory cell array 100. In this particular embodiment, there is one word line 102 for two rows of the array 100 and two bit lines 104 and 106 for each column of the array 100. Each memory cell 108 is located at a first or second crossing point of either a corresponding word line 102 and bit lines 104 or 106. It should be noted that the memory cell array can include hundreds if not thousands of memory cells and that there necessarily need not be an equal number of memory cells in each row versus the number of cells in each column. Specifically it is shown that there are at least two memory cells per row but that the number of column pairs per row need not be a one to one correspondence.

The memory cells 108 are not limited to any particular type of device. A spin dependent tunneling device may be used, as described above. Data is stored in the memory cells 108 by orienting the magnetization of each cell to represent a "1" or "0." For example, referring to FIG. 4, the logic value of "0" may be stored in the memory cell 108 by orienting the magnetization of the sense layer to the parallel to the magnetic orientation of the pinned layer, and the logic value of "1" may be stored in the memory cell by orienting the magnetization of the sense layer to the opposite indirection, or anti-parallel, to the magnetic orientation of the pinned layer. Further, memory cells manufactured utilizing phase change materials, known as phase change memory cells, may also be utilized.

Figure 5:
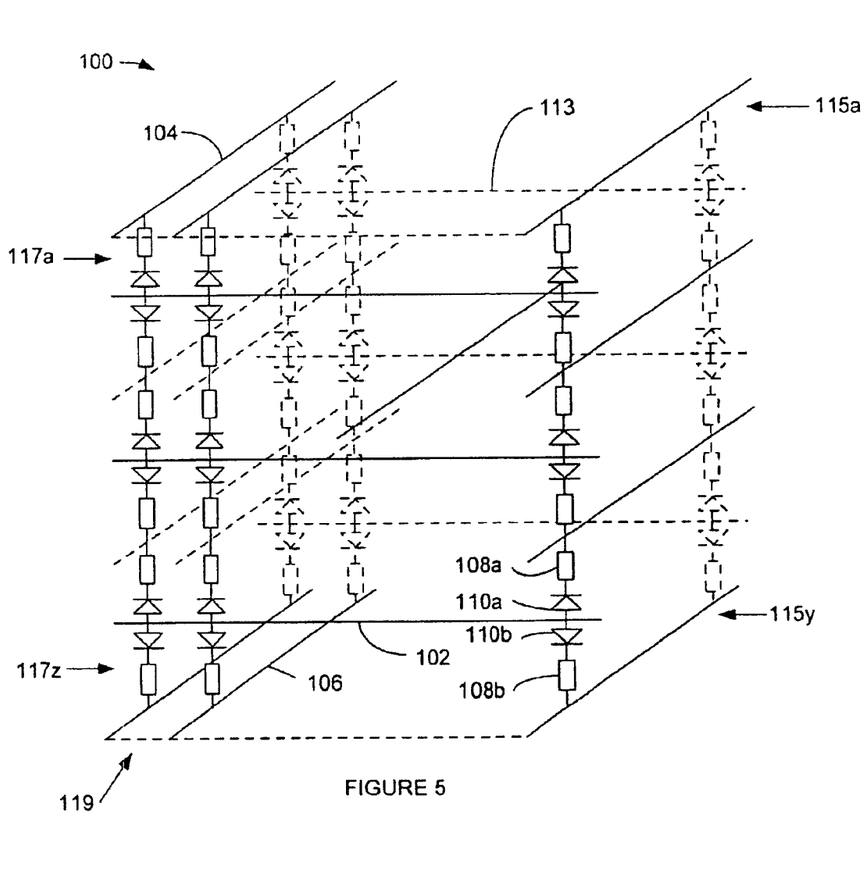
FIG. 5 illustrates a multi-plane MRAM memory cell array based on the array of FIG. 4.

FIG. 5 illustrates a schematic diagram of a three dimensional perspective view of a memory array 100 in accordance with the present invention. The memory array 100 illustrates that additional stacking layers of memory planes 117a–z is possible. In this example, not only are the memory planes 117 stackable in a vertical direction but they are also stackable from front to back, resulting in a three dimensional grid of shared conductor plane memory devices within a multi-plane memory array. The row conductor lines 102 continue to insert between the oppositely directed unidirectional conductors 110 and form a series of conductor planes 113. Further, the first column conductor 104 mates with the top portion of the memory devices 108 while the second column conductor 106 connects the bottom row of memory devices 108. The column conductors 104 and 106 form conductor planes 115a–115y. The unidirectional elements 110 typically are comprised of a one-way array; current conduction such as diode.

Figure 6:
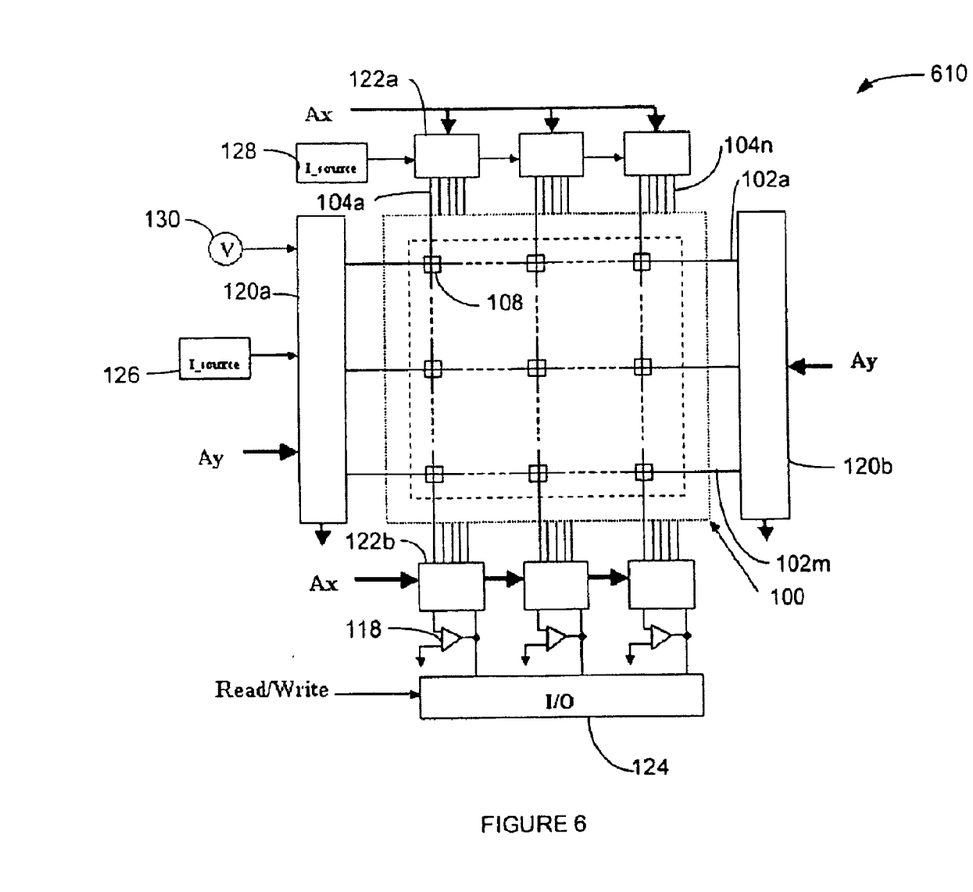
FIG. 6 illustrates a schematic diagram of a MRAM memory cell array with supporting read/write circuits as contemplated in the present invention.

FIG. 6 illustrates a single plane magnetic random access memory (MRAM) device 610 that includes word lines 102 and bit lines 104. Magnetic tunnel junctions 108 are located at cross points of word and bit lines 102 and 104 within single array plane 100. This array can also be illustrated by substituting conductor 106 for column conductor 104, which would represent a different plane. The magnetic tunnel junctions 108 are arranged in rows and columns, with the rows extending along an X direction and the columns extending along a Y direction. Only a relatively small number of magnetic tunnel junctions 108 within array plane 100 are shown to simplify the illustration of the MRAM device 610. In practice, arrays of any size may be used.

Traces functioning as word lines 102 extend along the X direction in a plane on one side of the array 100. The word lines 102 are in contact with the anode of diode 110. Traces functioning as bit lines 104 extend along the Y direction in a plane on an adjacent side of the array 100. The bit lines 104 are coupled to the data layers of the magnetic tunnel junction 108.

The MRAM device 610 also includes first and second row decoders 120a and 120b, first and second column decoders 122a and 122b, and a read/write circuit 124. The read/write circuit 124 includes a sense amplifier, ground connectors, a row current source, a voltage source, and a column current source.

During a write operation on a selected magnetic tunnel junction 108, the first row decoder 120a connects one end of a selected word line 102 to the row current source 126, the second row decoder 120b connects an opposite end of the selected word line 102 to ground, the first column decoder 122a connects one end of a selected bit line 104/106 to ground, and the second column decoder 122b connects the opposite end of the selected bit line 104/106 to the column current source 128. As a result, write currents flow through the selected word and bit lines 102 and 104/106.

The write currents generate a combined magnetic field at the selected bit cell that is sufficient to cause the selected magnetic tunnel junction 108 to switch. Other unselected memory cells 108 along the word line 102 and the bit line 104/106 only receive magnetic field from current flowing in either word line 102 or bit line 104/106. Thus the field is not large enough, so the state of unselected memory cells remains unchanged.

During a read operation on a selected magnetic tunnel junction 108, the first row decoder 120a connects the voltage source 130 to a selected word line 102, and the first column decoder 122b connects a selected bit line 104/106 to a virtual ground input of the sense amplifier 118.

As a result, a sense current ($I_s$) flows through the selected magnetic tunnel junction 108 to the sense amplifier 118. Sense current ($I_s$) is measured by the sense amplifier, and hence the resistance and logic states of the magnetic tunnel junction 108, can be determined.

Figure 7:
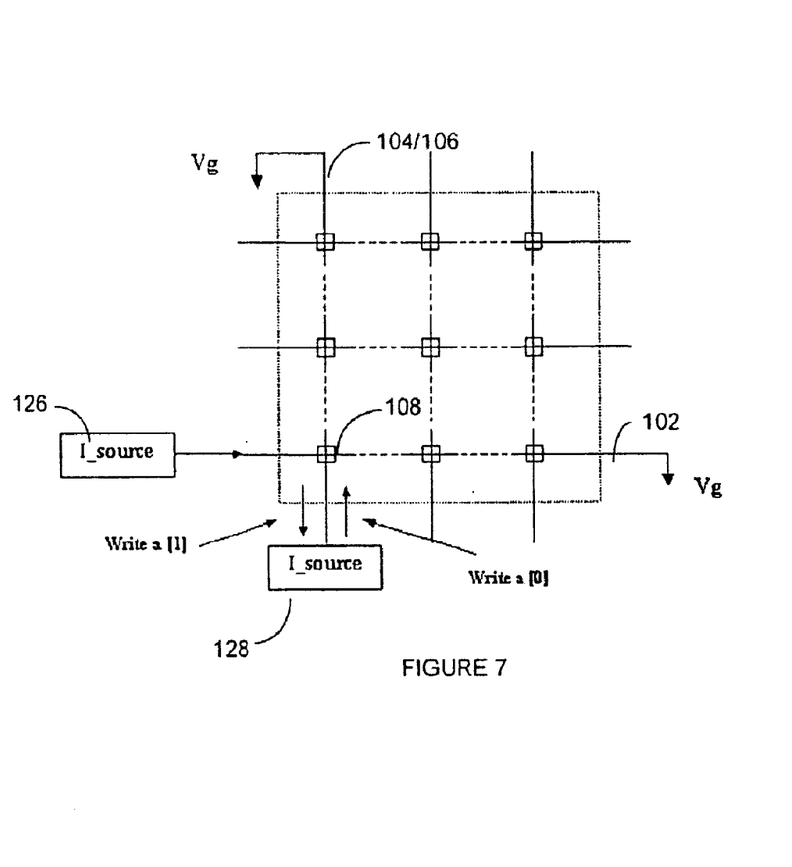
FIG. 7 illustrates a write process as performed on a memory plane of FIG. 4 in accordance with the present invention.
Figure 8:
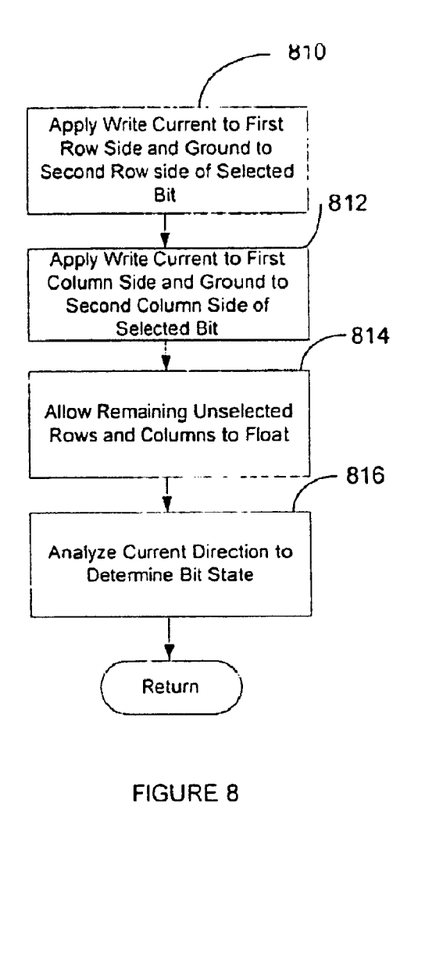
FIG. 8 depicts a flow diagram of the write process of FIG. 7.

FIG. 7 illustrates a schematic diagram of a write function on memory array 100 in accordance with the present invention. The method of writing data to a bit within an array of a selected plane memory includes the steps as outlined in the flow chart of FIG. 8. Initially, the circuit applies a write current to one side of the bits and ground the other side to the selected row corresponding to the selected bit or bits as shown in step 810. Next, the circuitry applies a right current to one side and ground the other side to the selected column corresponding to the selected bit(s) as illustrated in step 812. The array then allows all the remaining unselected rows and columns to float as shown in step 814. In step 816, the memory array analyzes the current direction on the selected column to determine whether a "1" or "0" is written.

Many bits can be written at one time, but bits that are written simultaneously must all be connected to the same row as illustrated in FIG. 6. Further, rows and columns may be used interchangeably with respect to the performance of a write function in accordance with the present invention.

Figure 9:
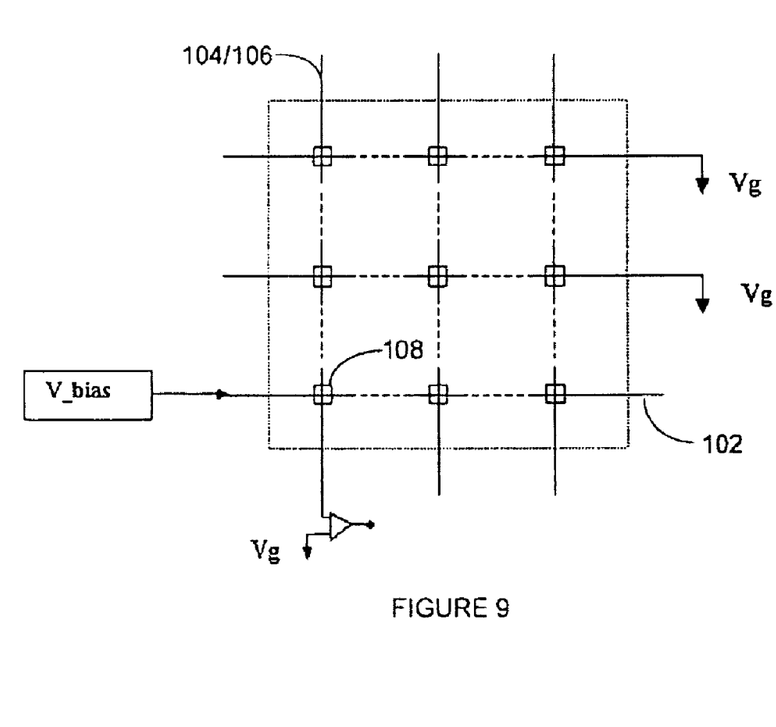
FIG. 9 illustrates a read process as performed on a memory plane of FIG. 4 in accordance with the present invention.
Figure 10:
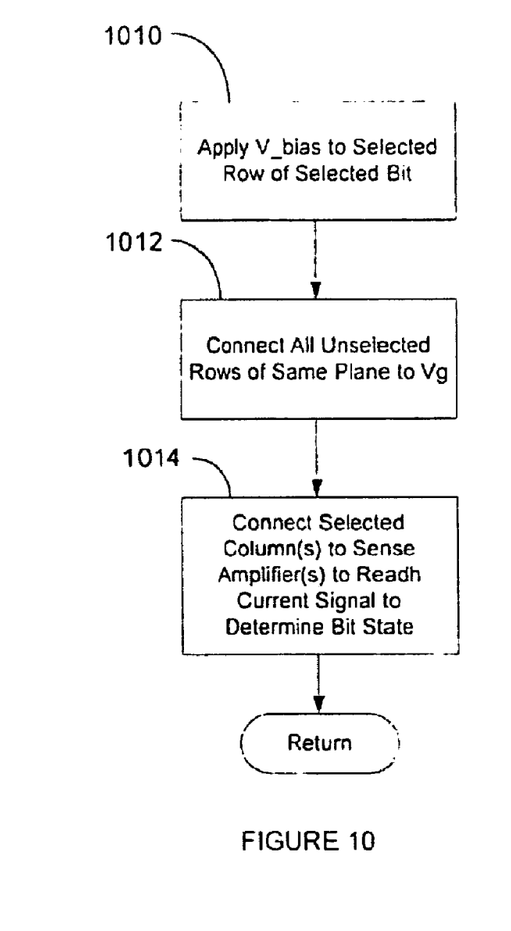
FIG. 10 depicts a flow diagram of the read process of FIG. 9.

A read function for a conductor plane is illustrated in the schematic diagram of FIG. 9. Further, the method is presented in accompanying FIG. 10. Thus, to read a bit in an array of a selected plane memory, the system applies a voltage V_bias to the selected row corresponding to the selected bit (as closed), as shown in step 1010. Next, as shown in step 1012, the array connects all unselected rows of the same memory plane to a voltage Vg, which represents ground potential or some common voltage typically selected by one skilled in the art. Afterwards, as shown in step 1014, the array connects the selected column(s) to the sense amplifier(s) to read the current signal to determine the state of the bit. In this method, only one row in the memory plane is selected at one time. Yet, many bits on the same row may be read at the same time per the array of FIG. 6.

Figure 11:
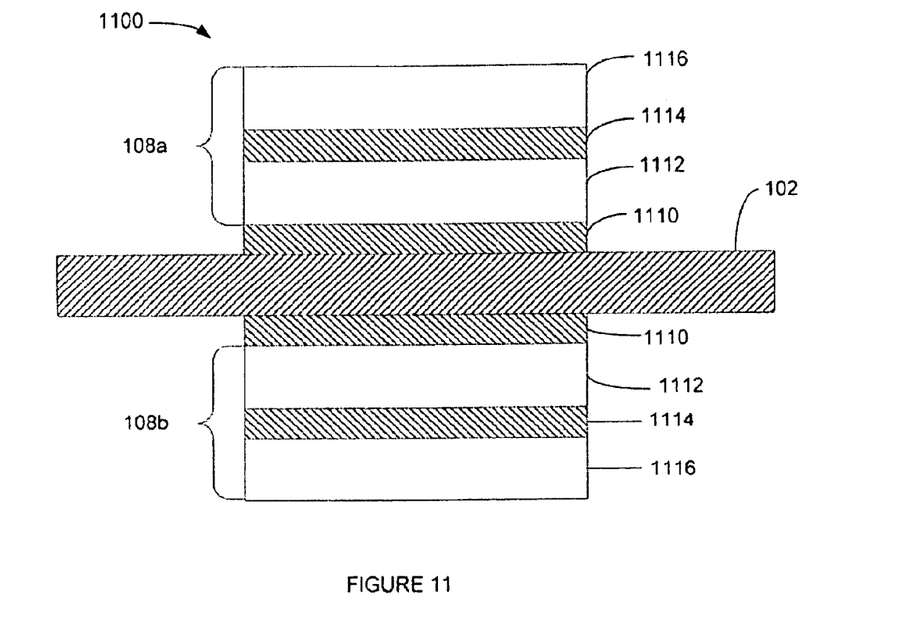
FIG. 11 illustrates a cross-sectional view of the MRAM memory cell as fabricated according the present invention.
Figure 12:
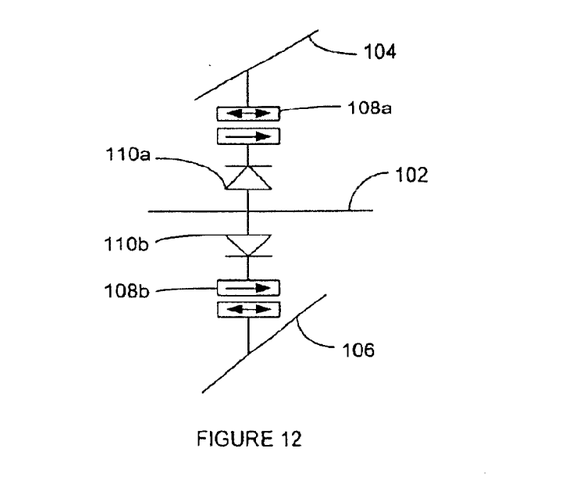
FIG. 12 illustrates an electrical equivalent circuit of cross-sectional view of the MRAM memory cell in FIG. 11 according the present invention.

FIG. 11 illustrates a cross sectional diagram of the resulting structure once fabricated. FIG. 12 illustrates the schematic equivalent of FIG. 11. In this portion of a bit pair 1100, the common row conductor 102 is positioned between the two bits 108a and 108b. Fabricating silicon diode 1110 on both sides of the word line conductor 102 forms the junction. The first memory cell 108a comprises a first magnetic pinned layer material 1112. Upon pinned layer 1112 is formed a dielectric layer 1114, which serves as the tunneling junction barrier for when the magnetic data layer 1116 is formed thereon. Memory bit 108b includes the same structure, but is a mirror image of the memory bit 108a across the word line conductor 102. The steps utilized in fabricating the memory array are consistent and compatible with well known steps of semi-conductor processing known to those skilled in the art of MRAM memory cell fabrication. The arrows within the data layer and pinned layer show the magnetic field orientation for those layers According to one specific embodiment, row conductor 102 is formed of platinum where a silicon material is placed on both sides of the platinum conductor to form the back-to-back Schottky barrier diodes or unidirectional conductors 110. Then, the tunneling junctions are fabricated adjacent the silicon layers resulting in a diode/MTJ memory cell 110. In this structure, three layers of conductors make up two memory layers, which process can be repeated to make multi-layered memory devices as shown in FIG. 6.

The present invention has several advantages over the prior art. One advantage is that fewer row conductor planes are necessary, thereby eliminating additional processing steps typically required in the prior art of having one row conductor per memory plane. Another advantage of the present invention over the prior art is that it reduces overhead by reducing the number of transistor switches necessary to provide multiplexing within the memory plane. Yet another advantage is that it reduces the overall device size in the resulting memory chip. Greater efficiencies, less expensive processing steps, and increased density are all significant advantages of the present invention over the prior art.

The logic value is stored in a selected memory cell as described above. With a voltage applied to the word line and bit line of the selected cell, the current across the junction of the memory cell determines whether the cell magnetization is parallel or anti-parallel. Preferably, an anti-parallel orientation will cause greater MTJ resistance and thus lower current across the junction of the selected memory cell. Preferably, each memory cell retains the magnetic orientation in the absence of power, thus being referred to as "non-volatile."

Preferably, the row and column conductors are made of highly conductive materials, such as copper or aluminum or conductive materials. In the MRAM memory cells, the pinned layer is composed of anti-ferrous material and the sense layer is composed of ferro-magnetic material influenced by a magnetic field, such as nickel iron, cobalt iron or nickel iron cobalt. The insulation layer may be composed of any type of insulation material such as $Al_2O_3$ and is very thin, usually not more than ten to fifty angstroms to allow a tunneling current to occur.

Although the above embodiments are representative of the present invention, other embodiments will be apparent to those skilled in the art from a consideration of this specification and the appended claims, or from a practice of the embodiments of the disclosed invention. It is intended that the specification and embodiments therein be considered as exemplary only, with the present invention being defined by the claims and their equivalents.

What is claimed is:

1. A process of making a data storage device, comprising:
   forming a plurality of word lines;
   forming a plurality of bit lines; and
   forming a first array plane of resistive cross point memory cells, each memory cell coupled to a first respective bit line and coupled to a first respective word line;
   forming a second array plane of resistive cross point memory cells, each memory cell coupled to a second respective bit line and a second respective word line, wherein a first memory cell from the first array plane and a second memory cell from the second array plane share a common word line;
   biasing the first array so that a current flows between the common word line and the first respective bit line through the first memory cell from the first
   blocking the current from flowing through the second memory cell from the second array during the biasing of the first array.

2. The process of claim 1 comprising during a read process forming a unidirectional conductive path between the common word line and a respective bit line through the first memory cell.

3. The process of claim 2, further comprising forming an equipotential generator coupled to the plurality of word lines and operable to set voltage levels in the first resistive cross point memory cell array to substantially prevent or divert selected parasitic currents from interfering with a sense current from the first memory cells.

4. The process of claim 3, wherein the equipotential generator is operable to set an input node of a common isolation diode of the first and second arrays of memory cells to avoid feedback from unselected word lines representing a common array voltage.

5. The process of claim 1, further comprising forming multiple read circuits, each read circuit coupled to one or more of the memory cells by a respective bit line and operable to sense current flow through any memory cell coupled thereto, the current flowing through the common word line.

6. The process of claim 5, wherein each read circuit comprises a sense amplifier.

7. The process of claim 6, wherein the sense amplifier is operable to compare current flowing through a selected memory cell with a reference current to produce a resistance state of the selected memory cell.

* * * * *